(12) United States Patent
Wang et al.

(10) Patent No.: US 10,847,740 B2
(45) Date of Patent: Nov. 24, 2020

(54) ORGANIC LIGHT-EMITTING DISPLAY PANEL AND ORGANIC LIGHT-EMITTING DISPLAY DEVICE WITH ELECTRON TRANSPORT LAYERS

(71) Applicant: Shanghai Tianma AM-OLED Co., Ltd., Shanghai (CN)

(72) Inventors: Xiangcheng Wang, Shanghai (CN); Jinghua Niu, Shanghai (CN); Ding Li, Shanghai (CN); Ping An, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 101 days.

(21) Appl. No.: 16/058,670

(22) Filed: Aug. 8, 2018

(65) Prior Publication Data
US 2019/0363270 A1   Nov. 28, 2019

(30) Foreign Application Priority Data

May 28, 2018 (CN) .......................... 2018 1 0520550

(51) Int. Cl.
*H01L 29/08* (2006.01)
*H01L 51/50* (2006.01)
(Continued)

(52) U.S. Cl.
CPC ......... *H01L 51/504* (2013.01); *G09G 3/3208* (2013.01); *H01L 27/1214* (2013.01);
(Continued)

(58) Field of Classification Search
CPC .......................... H01L 51/504; G09G 3/3208
(Continued)

(56) References Cited

U.S. PATENT DOCUMENTS 7,629,741 B2    12/2009  Liao et al.
2016/0111674 A1*  4/2016  Bae .................... H01L 51/5218
                                                             257/40
(Continued)

FOREIGN PATENT DOCUMENTS

CN          1725921 A      1/2006
CN          103839968 B    9/2016

*Primary Examiner* — Caleb E Henry
(74) *Attorney, Agent, or Firm* — Anova Law Group PLLC

(57) ABSTRACT

An organic light-emitting display panel includes an array substrate, a plurality of driving elements in the array substrate, and an organic light-emitting component corresponding to the driving elements, where the organic light-emitting component includes an anode, a cathode, and an organic functional layer between the anode and the cathode, the organic functional layer includes a light-emitting layer and a first electron transport layer between the light-emitting layer and the cathode, the organic light-emitting device includes a first organic light-emitting part containing a first color light-emitting layer, a second organic light-emitting part containing a second color light-emitting layer, and a third organic light-emitting part containing a third color light-emitting layer, a second electron transport layer is disposed between the first color light-emitting layer and the cathode, and a first and a second hole transport layers are disposed between the anode and the second and the third color light-emitting layers, respectively.

20 Claims, 5 Drawing Sheets

(51) Int. Cl.
  *G09G 3/3208*   (2016.01)
  *H01L 27/12*    (2006.01)
  *H01L 51/52*    (2006.01)

(52) U.S. Cl.
  CPC ........ *H01L 51/508* (2013.01); *H01L 51/5064* (2013.01); *H01L 51/5218* (2013.01); *H01L 51/5234* (2013.01)

(58) Field of Classification Search
  USPC .......................................................... 257/40
  See application file for complete search history.

(56) References Cited

U.S. PATENT DOCUMENTS

| | | | |
|---|---|---|---|
| 2017/0309861 A1* | 10/2017 | Wang | H01L 51/5056 |
| 2018/0183007 A1* | 6/2018 | Magno | C30B 29/54 |
| 2018/0226024 A1* | 8/2018 | Tang | G09G 3/3241 |

\* cited by examiner

ORGANIC LIGHT-EMITTING DISPLAY PANEL AND ORGANIC LIGHT-EMITTING DISPLAY DEVICE WITH ELECTRON TRANSPORT LAYERS

CROSS-REFERENCES TO RELATED APPLICATIONS

This application claims the priority of Chinese Patent Application No. 201810520550.4, filed on May 28, 2018, the entire content of which is incorporated herein by reference.

FIELD OF DISCLOSURE

The present disclosure relates to the field of organic light-emitting display and, more particularly, relates to an organic light-emitting display panel and an organic light-emitting display device thereof.

BACKGROUND

In recent years, with continuous development of display technology, various types of display devices, such as liquid crystal display devices and organic light-emitting display devices, have emerged within the display industry, and become the mainstream products in the display field. Among these display devices, the organic light-emitting display panel has become the mainstream trend in the development of display industry due to its excellent performance including its slim structure, low power consumption, intense brightness, high contrast, high resolution, wide viewing angle, etc., and is a hot research domain in the current display field.

An important component of the organic light-emitting display panel is the organic light-emitting diode. The organic light-emitting diode emits light by driving a light-emitting layer between the anode and the cathode through an electric field applied between the anode and the cathode. However, due to the different viewing angles of viewers with respect to the organic light-emitting display panels, the display effects of the organic light-emitting display panels may be different. This phenomenon is called an off-angle color cast. The off-angle color cast develops by reason of the change of optical path of the light under a wide viewing angle in the display panel and different degrees of light loss for the light with different wavelengths under a wide viewing angle. This results in blur and distortion of the displayed images under a wide viewing angle and affects the reception of displayed content by the viewers.

The disclosed methods and systems are directed to solve one or more problems set forth above and other problems.

BRIEF SUMMARY OF DISCLOSURE

In light of the above problems, the present disclosure provides an organic light-emitting display panel and an organic light-emitting display device thereof, to solve the problem of off-angle color cast in the organic light-emitting display panels, and to ameliorate the problems of brightness attenuation and distortion of the organic light-emitting display panels under a wide viewing angle.

In one aspect, the present disclosure provides an organic light-emitting display panel. The organic light-emitting display panel includes an array substrate, a plurality of driving elements in the array substrate, and an organic light-emitting component corresponding to the plurality of driving elements, where the organic light-emitting component includes an anode, a cathode, and an organic functional layer between the anode and the cathode, and the organic functional layer includes a light-emitting layer and a first electron transport layer located between the light-emitting layer and the cathode; the organic light-emitting component includes a first organic light-emitting part, a second organic light-emitting part, and a third organic light-emitting part, where the first organic light-emitting part includes a first color light-emitting layer, and a second electron transport layer is disposed between the first color light-emitting layer and the cathode; the second organic light-emitting part includes a second color light-emitting layer, and a first hole transport layer is disposed between the second color light-emitting layer and the anode; and the third organic light-emitting part includes a third color light-emitting layer, and a second hole transport layer is disposed between the third color light-emitting layer and the anode.

In another aspect, the present disclosure provides an organic light-emitting display device. The organic light-emitting display device includes a signal-generating component for generating a signal and an organic light-emitting display panel for displaying the signal, where the organic light-emitting display panel includes an array substrate, a plurality of driving elements in the array substrate, and an organic light-emitting component corresponding to the plurality of driving elements, where the organic light-emitting component includes an anode, a cathode, and an organic functional layer between the anode and the cathode, and the organic functional layer includes a light-emitting layer and a first electron transport layer located between the light-emitting layer and the cathode; the organic light-emitting component includes a first organic light-emitting part, a second organic light-emitting part, and a third organic light-emitting part, where the first organic light-emitting part includes a first color light-emitting layer, and a second electron transport layer is disposed between the first color light-emitting layer and the cathode; the second organic light-emitting part includes a second color light-emitting layer, and a first hole transport layer is disposed between the second color light-emitting layer and the anode; and the third organic light-emitting part includes a third color light-emitting layer, and a second hole transport layer is disposed between the third color light-emitting layer and the anode.

Other aspects of the present disclosure can be understood by those skilled in the art in light of the description, the claims, and the drawings of the present disclosure.

DETAILED DESCRIPTION

To make the objectives, technical solutions, and advantages of the present disclosure clearer, specific embodiments of the present disclosure will be made in detail with reference to the accompanying drawings.

It should be noted that specific details set forth in the following description are merely for illustration purposes. Modifications and changes may be made by those of ordinary skill in the relevant art without departing from the true spirit and scope of the present disclosure. The disclosure is not limited by the specific embodiments described in the following.

Figure 1:
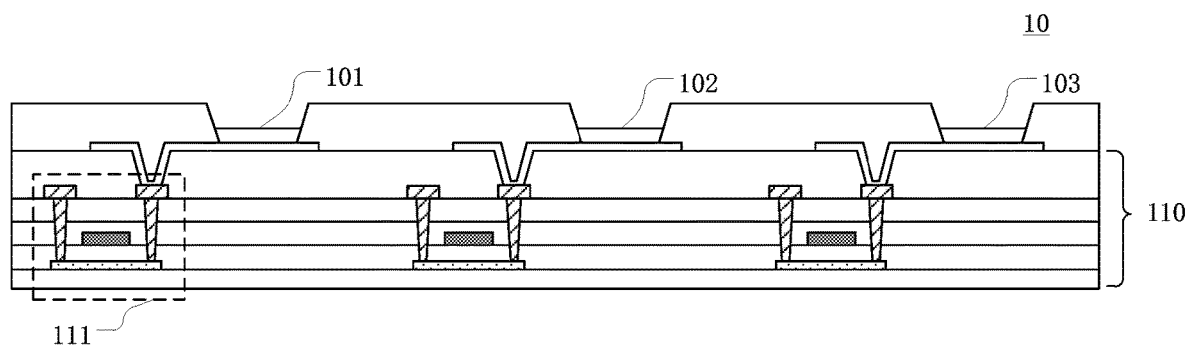
FIG. 1 illustrates a schematic structural diagram of an organic light-emitting display panel consistent with disclosed embodiments.

FIG. 1 illustrates a schematic structural diagram of an organic light-emitting display panel consistent with disclosed embodiments. The organic light-emitting display panel 10 includes an array substrate 110, a plurality of driving elements 111 included in the array substrate 110, and an organic light-emitting component corresponding to the plurality of driving elements. The organic light-emitting component includes a first organic light-emitting part 101, a second organic light-emitting part 102, and a third organic light-emitting part 103. It should be noted that, for simplicity purposes, only partial structures of the driving elements are shown in FIG. 1, to illustrate the correspondence between the driving elements and the organic light-emitting component. These structures should be constructed as illustrative rather than restrictive of specific driving elements. Based on the actual needs of an organic light-emitting display panel, the driving elements may include other structures, which will not be described here.

Figure 2:
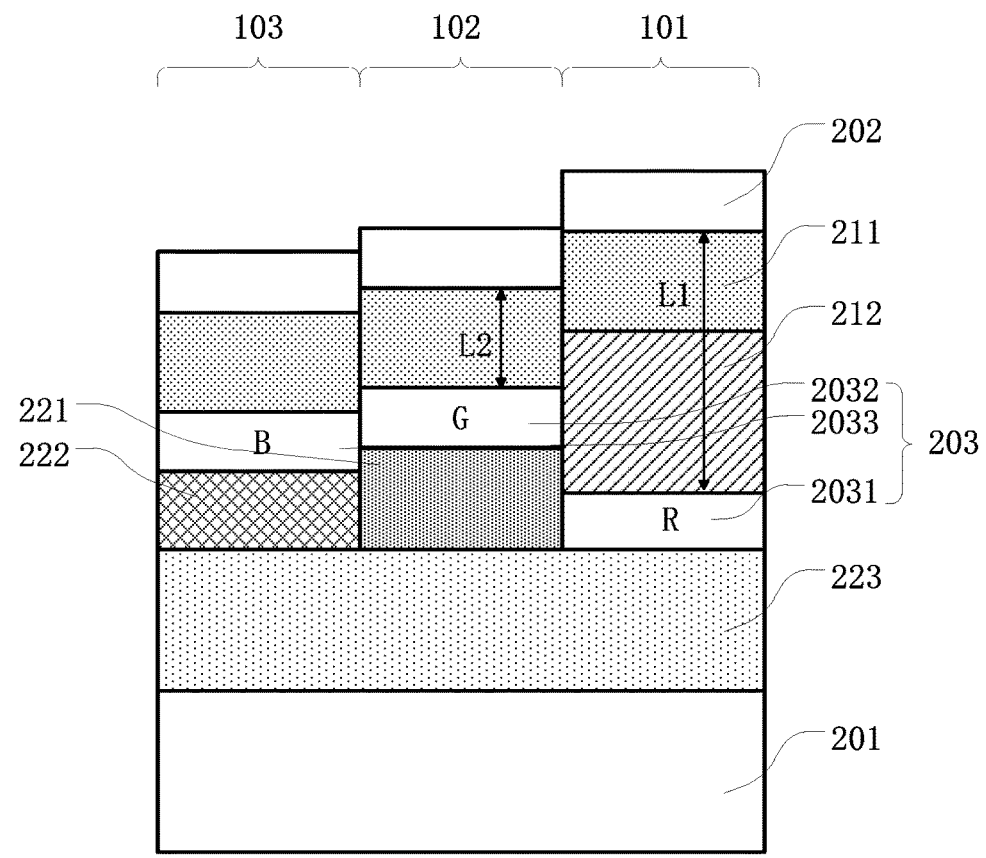
FIG. 2 illustrates a schematic structural diagram of an organic light-emitting component consistent with disclosed embodiments.

FIG. 2 illustrates a schematic structural diagram of an organic light-emitting component consistent with disclosed embodiments. The organic light-emitting component includes an anode 201, a cathode 202, and an organic functional layer between the anode 201 and the cathode 202. The organic functional layer includes a light-emitting layer 203, and a first electron transport layer 211 between the light-emitting layer 203 and the cathode 202. The organic light-emitting component includes a first organic light-emitting part 101, a second organic light-emitting part 102, and a third organic light-emitting part 103. The first organic light-emitting part 101 includes a first color light-emitting layer 2031. A second electron transport layer 212 is disposed between the first color light-emitting layer 2031 and the cathode 202. The second organic light-emitting part 102 includes a second color light-emitting layer 2032. A first hole transport layer 221 is disposed between the second color light-emitting layer 2032 and the anode 201. The third organic light-emitting part 103 includes a third color light-emitting layer 2033. A second hole transport layer 222 is disposed between the third organic light-emitting layer 2033 and the anode 201.

It should be noted that, in the above organic light-emitting component provided by the disclosed embodiments, the anode 201 and the cathode 202 refer to electrodes for applying a voltage. When a voltage is applied between the anode 201 and the cathode 202, an electric field is generated between the anode 201 and the cathode 202, and the organic functional layer is in the electric field. The light-emitting layer 203 refers to a film layer that generates light. The light-emitting layer generally includes a host material and a dopant material. The host material transports charge carriers such as electrons and holes to the dopant material. The dopant material absorbs the energy generated when electrons and holes recombine, and in turn emits light. An electron transport layer refers to a film layer between the cathode 202 and the light-emitting layer 203. Electrons generated by the cathode 202 are transported through the electron transport layer to the light-emitting layer. A hole transport layer refers to a film layer between the anode 201 and the light-emitting layer 203. Holes generated by the anode 201 are transported through the hole transport layer to the light-emitting layer.

In the disclosed embodiments, the anode 201 may be a total reflection electrode, and the cathode 202 may be a translucent electrode. The light-emitting layer 203 emits light from the cathode 202 side. However, the cathode node 202 may reflect a part of the light back to the interior of the organic light-emitting component, which, through reflection by the anode 201, is emitted again from the cathode side. This will lead to beams with different optical paths in the emitted light. Beams with different optical paths interfere with each other, resulting in the generation of the constructive and destructive interference. After combination, the emitted light has a narrowed spectral FWHM (full width at half maximum) and an increased peak height, which leads to the light with a higher purity. The process is called the microcavity effect in the organic light-emitting components. The light beams emitted by the first light-emitting layer, the second light-emitting layer, and the third light-emitting layer have different colors, and respectively correspond to different wavelengths and different constructive interference situations.

To obtain a high color purity across different colored light, independent adjustment of the microcavity length of each individual organic light-emitting part with different color might be necessary to adjust the optical paths of the light. In the disclosed embodiments, by disposing a second electron transport layer 212 between the first color light-emitting layer 2031 and the cathode 202, a first hole transport layer 221 between the second color light-emitting layer 2032 and the anode 201, and a second hole transport layer 222 between the third color light-emitting layer 2033 and the anode 201, the microcavity length of the first organic light-emitting part may be adjusted through the electron transport layers, and the microcavity lengths of the second organic light-emitting part and the third organic light-emitting part may be adjusted through the hole transport layers. When the color cast of the first organic light-emitting part is more severe than that of the other organic light-emitting parts under a wide viewing angle, the microcavity may be adjusted through the electron transport layers with a specific refractive index combination, to reduce the light loss of the first organic light-emitting part. This further ameliorates the brightness attenuation and color cast of the organic light-emitting component, thereby improving the display performance of the organic light-emitting display panel.

Optionally, in the disclosed embodiments, the first color is red, the second color is green, and the third color is blue. In the organic light-emitting display panel provided by the disclosed embodiments, the brightness attenuation of the red color light-emitting part is most significant under a wide viewing angle, while the brightness attenuation of the green one is the least. Therefore, the display panel appears green under a wide viewing angle. By disposing the electron transport layers to adjust the color cast of the red organic light-emitting component, the overall color cast of the organic light-emitting display panel may be minimized, thereby improving the display performance of the display panel. It should be noted that, in some embodiments, due to the different structures of the organic light-emitting display panels, the color cast of another color may be greater than the color cast of the red organic light-emitting part. In that case, a color other than the red color may also be used as the first color, without any intention to be limiting.

Optionally, in the disclosed embodiments, for the first electron transport layer 211 and the second electron transport layer 212, the one closer to the cathode 202 has a greater refractive index than the one further away from the cathode 202. In the disclosed embodiments, the cathode side is the light emitting side. Light emitted by the first color light-emitting layer 2031 passes through the first electron transport layer and the second electron transport layer to reach the cathode 202. To decrease the color cast of the first organic light-emitting part 101, the electron transport layers needs to extract the light as much as possible to prevent a loss of the light. This imposes certain requirements on the refractive indexes of the electron transport layers. An exemplary description will be provided in the following by reference to a structure of the second electron transport layer 212 disposed between the first electron transport layer 211 and the cathode 202.

Figure 3:
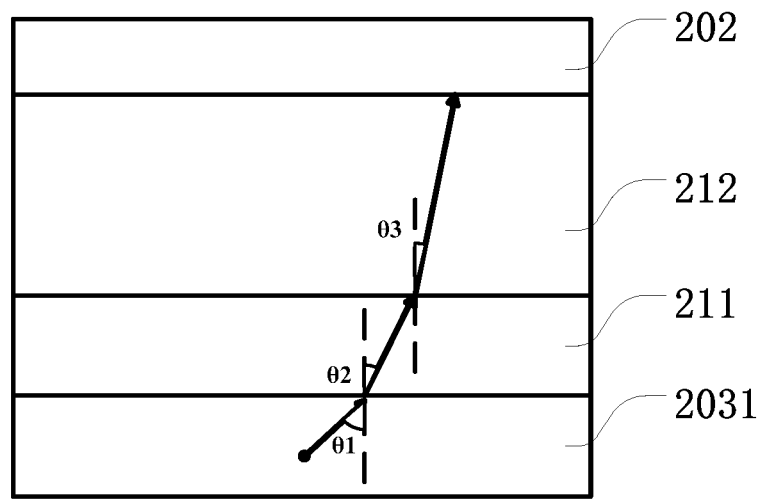
FIG. 3 illustrates a schematic diagram of light transmission between a first color light-emitting layer and a cathode consistent with disclosed embodiments.

FIG. 3 illustrates a schematic diagram of light transmission between a first color light-emitting layer and a cathode consistent with the disclosed embodiments. The light emitted by the first color light-emitting layer 2031 passes through the first electron transport layer 211. The refractive index n2 of the first electron transport layer 211 is greater than the refractive index n1 of the first color light-emitting layer 2031.

By the Law of Refraction: n1/n2=sin θ2/sin θ1, it follows that θ2<θ1. At the interface of the first color light-emitting layer 2031 and the first electron transport layer 211, light is extracted to the light-emitting side for the first time. Likewise, the refractive index n2 of the first electron transport layer 211 is smaller than the refractive index n3 of the second electron transport layer 212. By the Law of Refraction, it follows that θ3<θ2. Thus, light is extracted to the light-emitting side for the second time at the interface between the first electron transport layer and the second electron transport layer.

This results in an improved light-emitting efficiency of the first color light-emitting layer 2031, and thus prevents a significant loss of the light for the first color, ameliorates the color cast of the light for the first color, and improves the display performance of the display panel. Specifically, in the disclosed embodiments, for the light with a wavelength λ=620 nm, the refractive index of the first color light-emitting layer 2031 may be 1.45-1.6, the refractive index of the first electron transport layer 211 may be 1.6-1.7, and the refractive index of the second electron transport layer 212 may be 1.7-1.8.

In some implementations of the disclosed embodiments, as shown in FIG. 2, the second electron transport layer 212 may also be disposed between the first electron transport layer 211 and the first color light-emitting layer 2031. In this case, the refractive index of the second electron transport layer 212 is smaller than the refractive index of the first electron transport layer 211, which also creates a light extraction effect that ameliorates the color cast of the light for the first color.

In the above-disclosed embodiments, the refractive index of the first electron transport layer 211 is different from the refractive index of the second electron transport layer 212. That is, the materials for the first electron transport layer 211 and the second electron transport layer 212 are different. In some embodiments, the first electron transport layer 211 and the second electron transport layer 212 may include the same material with them, which the disclosed embodiments are not intended to limit.

As can be seen from the above, by disposing a second electron transport layer 212 between the first color light-emitting layer 2031 and the cathode 202, the microcavity length of the first light-emitting device 101 may be adjusted in one aspect. In another aspect, the light output rate of the light for the first color may also be improved, which leads to a reduced color cast of the light for the first color.

In the above embodiments, as can be seen from the description, the second electron transport layer 212 is only placed within the first organic light-emitting part 101. Therefore, in the direction perpendicular to the surface of the array substrate, the distance L1 between the first color layer 2031 and the cathode 202 is greater than the distance L2 between the second color layer 2032 and the cathode 202.

Figure 4:
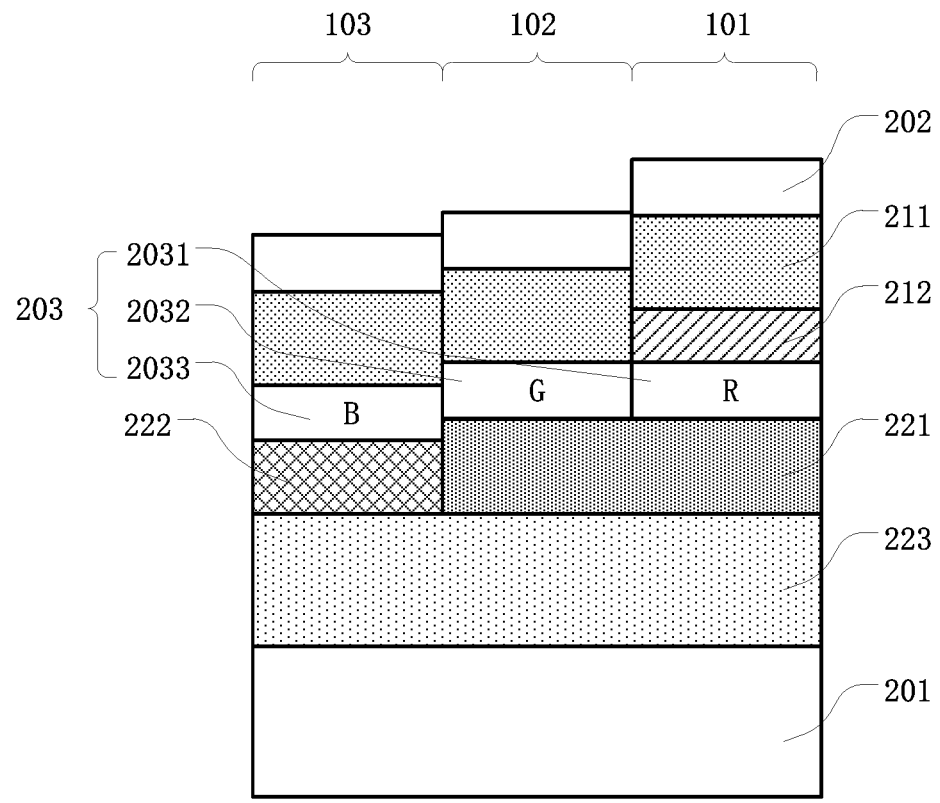
FIG. 4 illustrates a schematic structural diagram of another organic light-emitting component consistent with disclosed embodiments.

In the above embodiments, there is no first hole transport layer 221 between the first color light-emitting layer 2031 and the anode 201. The first hole transport layer 221 only serves to adjust the microcavity length of the second organic light-emitting part 102. In some implementations of the disclosed embodiments, as shown in FIG. 4, a schematic structural diagram of another organic light-emitting component is illustrated. Here, a first hole transport layer 221 is disposed between the first color light-emitting layer 2031 and the anode 201. When the first color is red, the microcavity length of the first organic light-emitting part 101 is large. Since the hole mobility rate is generally larger than the electron mobility rate for the disclosed organic light-emitting components, merely adjusting the microcavity length of the first organic light-emitting part through the electron transport layers may cause the electron transfer rate of the first organic light-emitting part to be too low. This will cause the recombination center for the holes and electrons to deviate from the first color light-emitting layer, thereby affecting the light-emitting efficiency of the light-emitting layer. Through the cooperative adjustment of the microcavity length of the first organic light-emitting part by the first hole transport layer 221 and the second electron transport layer 212, the transfer rates of the electrons and holes may be balanced, thereby preventing the above-described situation.

Still referring to FIG. 4, in the disclosed embodiments, a third hole transport layer 223 is further disposed between the light-emitting layer 203 and the anode 201. The third hole transport layer 223 mainly serves to transfer holes from the anode 201 to the first hole transport layer 221 and the second hole transport layer 222. The material of the third hole transport layer may be the same as or different from the materials of the first hole transport layer and the second hole transport layer, which the disclosed embodiments are not intended to limit.

Further, as shown in FIG. 4, the first hole transport layer 221 is located between the first color light-emitting layer 2031, the second color light-emitting layer 2032, and the third hole transport layer 223, and the second hole transport layer 222 is located between the third color light-emitting layer 2033 and the third hole transport layer 223.

In this structure, the microcavity length of the second organic light-emitting part 102 is mainly adjusted by the first hole transport layer 221, and the microcavity length of the third organic light-emitting part 103 is mainly adjusted by the second hole transport layer 222. To ensure effective microcavity adjustment for each organic light-emitting component, assume a case when the first color is red, the second color is green, and the third color is blue. The wavelengths of the blue light, green light, and red light are sequentially longer. Accordingly, the thickness of the second hole transport layer 222 is set to be smaller than the thickness of the first hole transport layer 221, and the thickness of the second electron transport layer 212 is set to be greater than the thickness of the first hole transport layer 221, so that the requirements for the length adjustment of each microcavity can be satisfied. Specifically, in the disclosed embodiments, the thickness of first hole transport layer 221 may be between 40-55 nm, the length of the second hole transport layer 222 may be between 15-25 nm, and the thickness of the second electron transport layer 212 may be between 45-60 nm. In the structure shown in FIG. 2, the thickness of the second electron transport layer may be between 80-100 nm.

Figure 5:
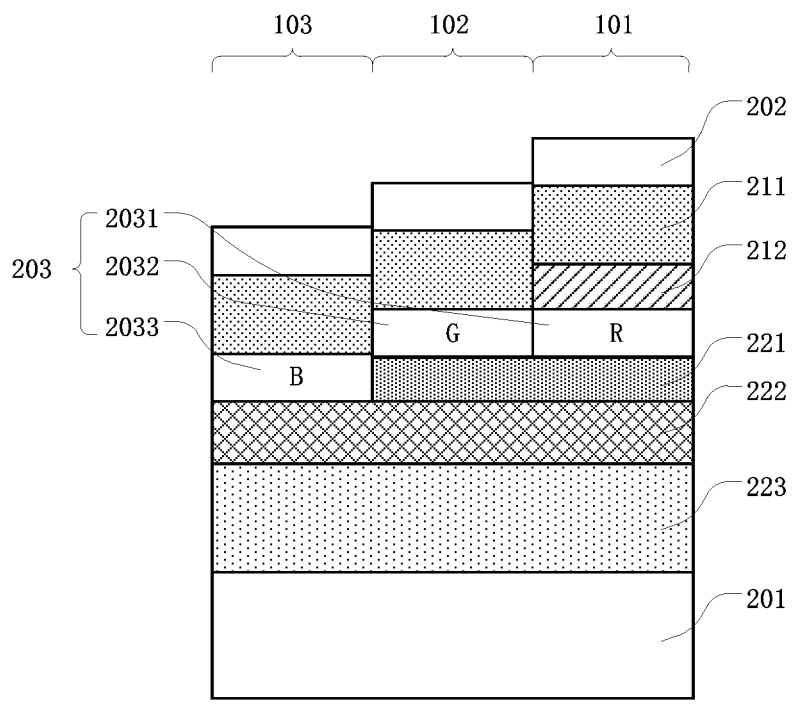
FIG. 5 illustrates a schematic structural diagram of another organic light-emitting component consistent with disclosed embodiments.
Figure 6:
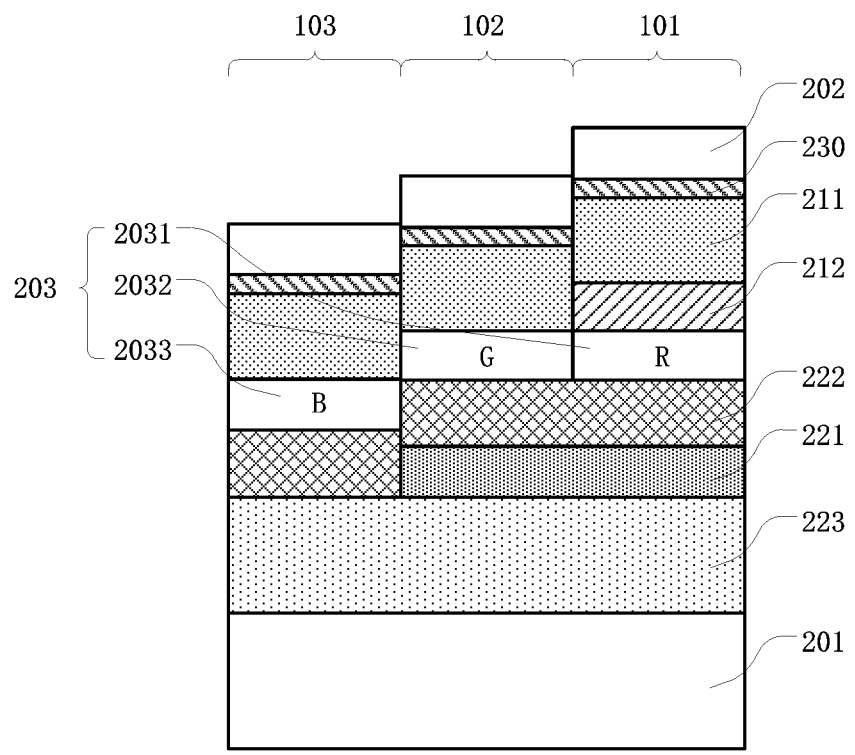
FIG. 6 illustrates a schematic structural diagram of another organic light-emitting component consistent with disclosed embodiments.

Optionally, in the disclosed embodiments, the second hole transport layer 222 may also be disposed between the first color light-emitting layer 2031, the second color light-emitting layer 2032, and the third hole transport layer 223. Specifically, referring to FIG. 5, a schematic structural diagram of another organic light-emitting component consistent with disclosed embodiments is provided. Here, the second hole transport layer 222 is located between the first hole transport layer 221 and the third hole transport layer 223. Referring to FIG. 6, a diagram of yet another organic light-emitting component consistent with disclosed embodiments is provided. Here, the first hole transport layer 221 is located between the second hole transport layer 222 and the third hole transport layer 223. In this structure, at the time that the microcavity length of the third organic light-emitting part 103 is adjusted by the second hole transport layer 222, the microcavity lengths of the first organic light-emitting part 101 and the second organic light-emitting part 102 may also be adjusted by the second hole transport layer 222. In this way, during the actual fabrication process, the second hole transport layer 222 may be produced through just one vaporization process using a shared mask without a requirement of using a fine mask, thereby simplifying the fabrication process.

Further, in the above-described structure, the third organic light-emitting part 103 adjusts its microcavity length through only the second hole transport layer 222, but the second organic light-emitting part 102 adjusts its microcavity length through both the first hole transport layer 221 and the second hole transport layer 222. Therefore, the distance between the third color light-emitting layer 2033 and the anode 201 is smaller than the distance between the second color light-emitting layer 2032 and the anode 201.

Optionally, in the disclosed embodiments, a first dopant is injected into one of the first electron transport layer 211 and the second electron transport layer 212 that is closer to the cathode. The first dopant may include alkaline earth metal elements or rare earth metal elements. Optionally, the first dopant may be one or more types of alkaline earth metals and rare earth metals, or metal compounds of alkaline earth metals or rare earth metals, such as metal oxides, metal halides, or metal complexes. Studies have shown that, when injected into an electron transport layer, some single elements of rare earth metals or alkaline earth metals or their compounds may reduce the interface electric resistance between the cathode and the electron transport layer, thereby improving the ability of the cathode to inject electrons into the electron transport layer and improving the response speed and light-emitting efficiency of an organic light-emitting component.

Further, in the disclosed embodiments, the work function of the first dopant may be smaller than that of the cathode. This setting may further enhance the ability of the cathode to inject electrons. Specifically, the first dopant may include metal elements such as Mg, Ga, Yb, Sm, Gd, Tm, Lu, Y, etc. In one example, the first dopant is the Yb element. Here, the first dopant may be the Yb single element, or a compound containing Yb. Through experiments, it is found that, when the doping ratio of Yb in the first electron transport layer or the second electron transport layer is less than 7%, a desirable electron injection performance may be achieved. This helps improve the light-emitting efficiency of the organic light-emitting component.

In addition, in some embodiments, as shown in FIG. 6, an electron injection layer 230 is further disposed between the cathode 202 and one of the first electron transport layer 211 and the second electron transport layer 212 that is closer to the cathode (the first electron transport layer in the illustrated embodiment). The refractive index of the electron injection layer 230 is greater than the refractive indexes of the first electron transport layer and the second electron transport layer for visible light. The electron injection layer 230 is located relatively closer to the cathode when compared with the first electron transport layer 211 and the second electron transport layer 212. That is, the electron injection layer 230 is located on the light-emitting side. Such refractive index setting may further enhance the light extraction performance of an organic light-emitting component, thereby improving the light-emitting efficiency of the organic light-emitting component. Specifically, the electron injection layer 230 may have a refractive index of 1.8-1.9 for the visible light with a wavelength of $\lambda=620$ nm.

Further, in the disclosed embodiments, the electron injection layer 230 may optionally include at least one of an alkaline earth metal or a rare earth metal, specifically, a metal Mg, Ga, Yb, Sm, Gd, Tm, Lu, or Y, etc. The electron injection layer 230 may be a single element of an alkaline earth metal or a rare earth metal, or a compound of an alkaline earth metal or a rare earth metal. A setting like this may further improve the ability of the cathode to inject electrons into the electron transport layers.

Optionally, in the disclosed embodiments, the material of the second electron transport layer 211 may include o-phenanthroline or 2,2'-bipyridine. The specific structure may be a structure represented by the Formula (I) or (II) below:

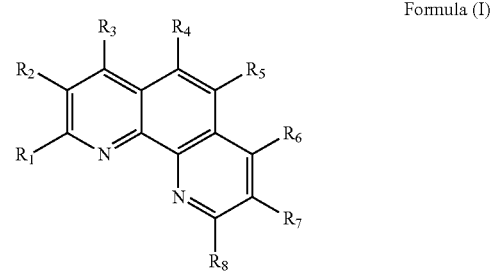

Formula (I)

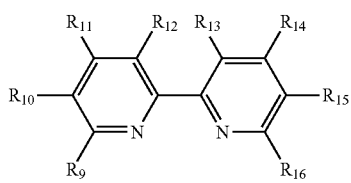

Formula (II)

Here, R1 to R8 each may be independently selected from a hydrogen atom, a substituted or unsubstituted alkyl group having 1 to 30 carbon atoms, a substituted or unsubstituted aryl group or heterocyclic aryl group having 6 to 30 carbon atoms.

R9-R16 each may be independently selected from a hydrogen atom, a substituted or unsubstituted alkyl group having 1 to 30 carbon atoms, a substituted or unsubstituted aryl group or a heterocyclic aryl group having 6 to 30 carbon atoms.

More specifically, the formula of the second electron transport layer 212 may be a Compound 1 or Compound 2. The first electron transport layer 211 may have the same formula as the second electron transport layer 212, or may be a Compound 3.

Compound 1

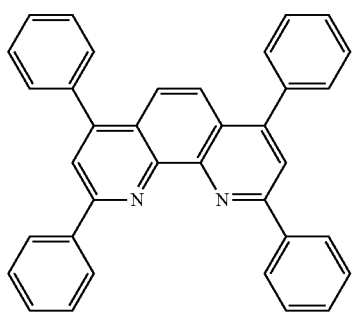

Compound 2

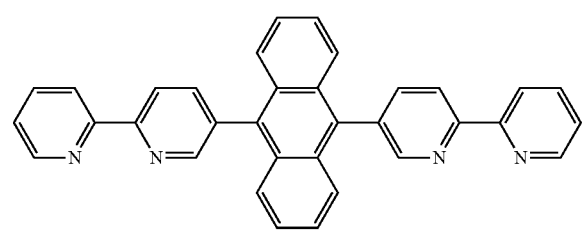

Compound 3

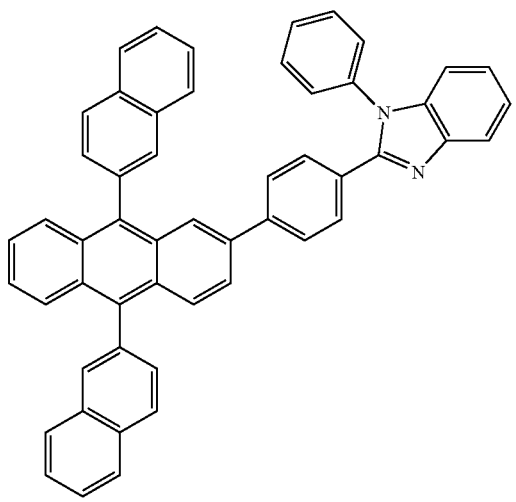

In addition, in the disclosed embodiments, the structure of the first hole transport layer 221 may be a carbazole compound and, more specifically, a Compound 4. The structure of the second hole transport layer 222 may be an aromatic amine compound and, more specifically, a Compound 5. The structure of the third hole transport layer 223 may be the same as the structure of the first hole transport layer 221. In addition, the third hole transport layer may also include a P-type dopant to further enhance hole injection and transport performance.

Compound 4

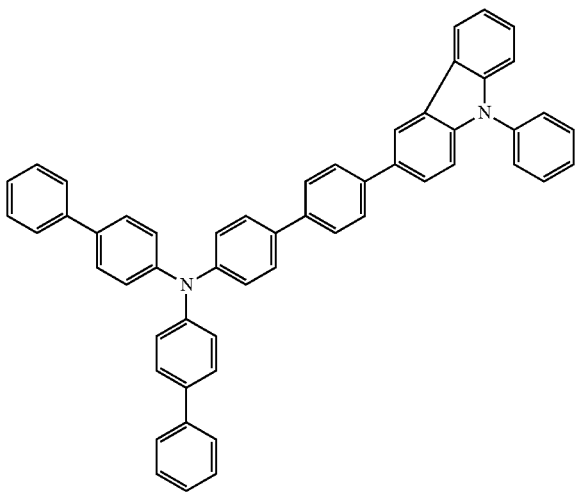

Compound 5

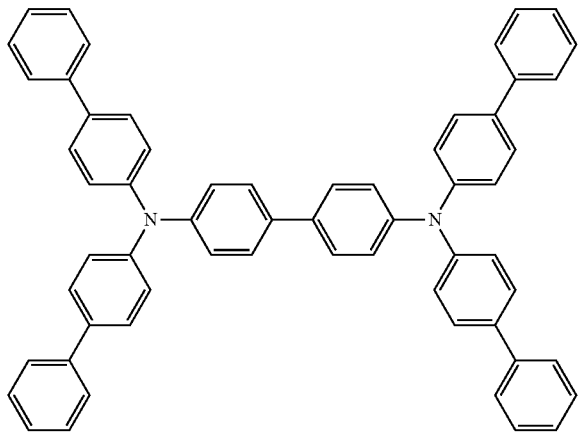

In the disclosed embodiments, the anode 201 may be a three-layer structure comprising ITO/Ag/ITO, where ITO is indium tin oxide. Alternatively, using other conductive metals or oxides with a work function of 4.3-5.8 eV to place ITO may also be applicable, which the present disclosure is not intended to limit. The cathode 202 may be Ag or a metal alloy containing Ag, such as an Mg/Ag alloy or an Ag/Yb alloy, which the present disclosure is not intended to limit, either.

As can be seen from the above, the present disclosure provides an organic light-emitting display panel and an organic light-emitting display device. In the organic light-emitting component included in the organic light-emitting display panel, a second electron transport layer is disposed between the first color light-emitting layer and the cathode, a first hole transport layer is disposed between the second color light-emitting layer and the anode, a second hole transport layer is disposed between the third color light-emitting layer and the anode. The above structure allows the second organic light-emitting part and the third organic light-emitting part to adjust their respective microcavity lengths through the hole transport layers, and allows the first organic light-emitting part to adjust its microcavity length through the electron transport layers. When the color cast of the first organic light-emitting part is more severe than the color casts of the second organic light-emitting part and the third organic light-emitting part, the microcavity of the first organic light-emitting part may be adjusted by the electron transport layers between the light-emitting layer and the cathode with a specific refractive index combination. This allows the first light-emitting part to have a small amount of light loss under a wide viewing angle, and thus the brightness attenuation and color cast under a wide viewing angle can be ameliorated, resulting in an improved display performance of the organic light-emitting display panel.

The performance of the organic light-emitting component and the organic light-emitting display panel provided by the present disclosure will be made in detail with reference to the following specific embodiments.

Embodiment 1

Figure 7:
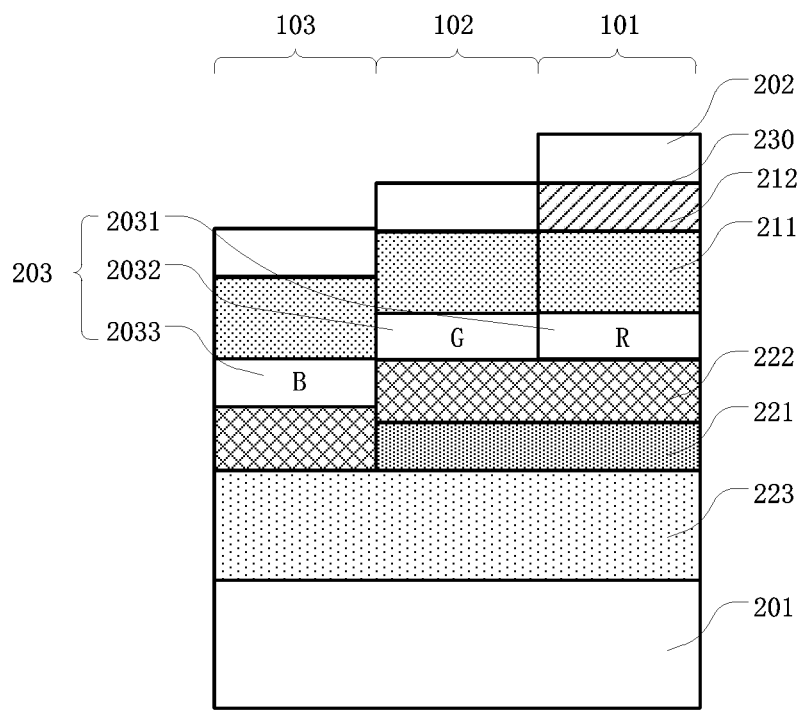
FIG. 7 illustrates a schematic structural diagram of another organic light-emitting component consistent with disclosed embodiments.

FIG. 7 illustrates a schematic structural diagram of another organic light-emitting component consistent with disclosed embodiments. Here, the cathode 202 is an Mg/Ag alloy and has a thickness of 20 nm. The second electron transport layer 212 is located between the first electron transport layer 211 and the cathode 202. The second electron transport layer 212 has a structure of Compound 1 and has a thickness of 45 nm. The first electron transport layer 211 has a structure of Compound 3 and has a thickness of 40 nm. The first hole transport layer 221 has a structure of Compound 5 and has a thickness of 40 nm. The second hole transport layer 222 has a structure of Compound 4 and has a thickness of 20 nm. The third hole transport layer 223 has the same material as the first hole transport layer 221 and has a thickness of 40 nm. The anode is ITO/Ag/ITO, where ITO has a thickness of 10 nm, and Ag has a thickness of 100 nm. The first color light-emitting layer 2031 is red, the second color light-emitting layer 2032 is green, and the third color light-emitting layer 2033 is blue.

Comparison Embodiment 1

Figure 8:
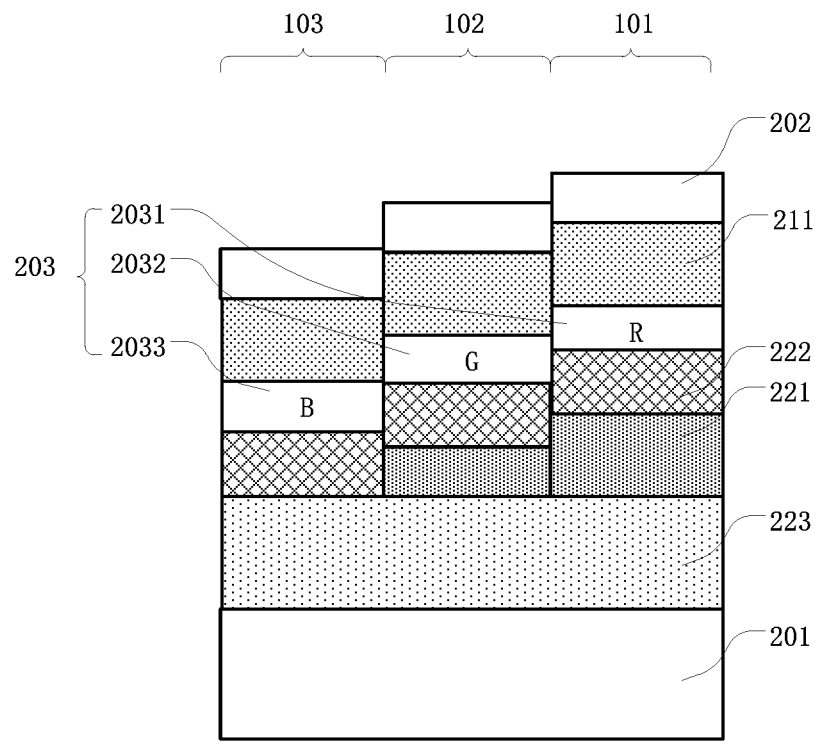
FIG. 8 illustrates a schematic structural diagram of an organic light-emitting component of a comparison embodiment consistent with disclosed embodiments.

FIG. 8 illustrates a schematic structural diagram of an organic light-emitting component of a comparison embodiment consistent with disclosed embodiments. Here, the other structures for the organic light-emitting component shown in FIG. 8 are the same as the corresponding structures in Embodiment 1, except that: there is no second electron transport layer 212 between the first color light-emitting layer 2031 and the cathode 202, and the microcavity length is adjusted by the hole transport layers, and a first hole transport layer 221 with a thickness of 80 nm is disposed between the first color light-emitting layer 2031 and the anode 201.

Table 1 illustrates a comparison of the experiment parameters and performance between Embodiment 1 and Comparison Embodiment 1:

TABLE 1

|  | Light-emitting Efficiency R | Light-emitting Efficiency G | Light-emitting Efficiency B | 45° viewing angle color cast (R) |
| --- | --- | --- | --- | --- |
| Embodiment 1 | 43 Cd/A | 100 Cd/A | 6 Cd/A | 0.015 |
| Comparison Embodiment 1 | 40 Cd/A | 100 Cd/A | 6 Cd/A | 0.033 |

In the above table, R, G, and B represent red, green, and blue organic light-emitting parts, respectively. As can be seen from the above table, for the structure of Embodiment 1, the light-emitting efficiency of the red organic light-emitting part is improved relative to Comparison Embodiment 1. The red organic light-emitting part also has a significant decrease in the value of 45° off-angle color cast. It should be noted that the above 45° off-angle color cast values are the Δu·v values obtained after comparing the parameters of the light comprehensively measured under a certain viewing angle with the parameters measured under the center view. The smaller the value of Δu·v, the less obvious of the off-angle color cast, and the better display performance of the corresponding display panel.

Figure 9:
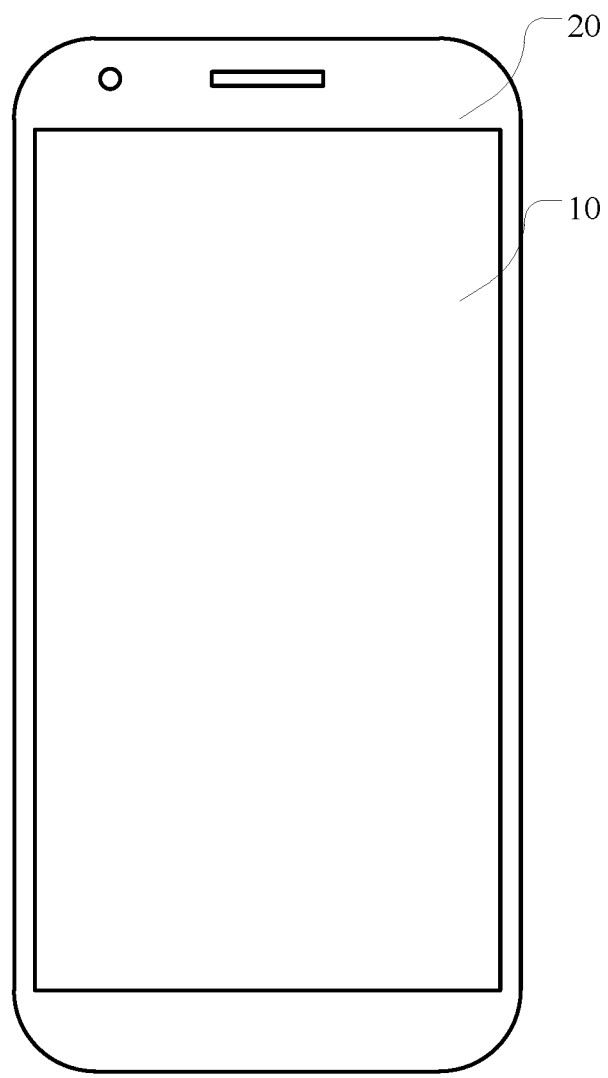
FIG. 9 illustrates a schematic diagram of an organic light-emitting display device consistent with disclosed embodiments.

In another aspect, the present disclosure further provides an organic light-emitting display device that includes any of the display panels consistent with the disclosed embodiments. Referring to FIG. 9, a schematic diagram of an organic light-emitting display device consistent with disclosed embodiments is provided. Here, the organic light-emitting display device 20 includes an organic light-emitting display panel 10. The display panel may be any of the display panels consistent with the above-disclosed embodiments. The organic light-emitting display device may be a television, a notebook computer, a mobile phone, a smart wearable display, a watch, or any other display device, which the present disclosure is not intended to limit.

As can be seen from the above description, in the organic light-emitting display panel and the organic light-emitting display device provided by the disclosed embodiments, the red organic light-emitting part adjusts its microcavity length through the electron transport layers, the green light-emitting device and the blue organic light-emitting component adjust their respective microcavity lengths through the hole transport layers. Through specific refractive index combination, the electron transport layers may improve the light-emitting efficiency of the red light. Accordingly, the problem of the more severe color cast for the red color under a wide viewing angle may be solved, and the problem of the color cast under a wide viewing angle for the display panel may be addressed. The phenomena of image blurring and distortion under a wide viewing angle may be then prevented, and a better display performance is achieved.

Although the present disclosure has been described as above with reference to specific embodiments, these embodiments are not constructed as limiting the present disclosure. Any modifications, equivalent replacements, and improvements made without departing from the spirit and principle of the present disclosure shall fall within the scope of the protection of the present disclosure.

What is claimed is:

1. An organic light-emitting display panel, comprising an array substrate;
a plurality of driving elements in the array substrate; and
an organic light-emitting component corresponding to the plurality of driving elements,
wherein:
the organic light-emitting component includes an anode, a cathode, and an organic functional layer between the anode and the cathode, wherein the organic functional layer includes a light-emitting layer and a first electron transport layer located between the light-emitting layer and the cathode,
the organic light-emitting component includes a first organic light-emitting part, a second organic light-emitting part, and a third organic light-emitting part, wherein the first organic light-emitting part includes a first color light-emitting layer, and a second electron transport layer is disposed between the first color light-emitting layer and the cathode,
the second organic light-emitting part includes a second color light-emitting layer, and a first hole transport layer is disposed between the second color light-emitting layer and the anode,
the third organic light-emitting part includes a third color light-emitting layer, and a second hole transport layer is disposed between the third color light-emitting layer and the anode, and
a third hole transport layer is disposed between the light-emitting layer and the anode, wherein the first hole transport is directly sandwiched by the second color light-emitting layer and the third hole transport layer.

2. The organic light-emitting display panel according to claim 1, wherein the first color is red, the second color is green, and the third color is blue.

3. The organic light-emitting display panel according to claim 1, wherein,
when the first electron transport layer is closer to the cathode than the second electron transport layer, the first electron transport layer has a greater refractive index than the other that is further away from the cathode, and
when the second electron transport layer is closer to the cathode than the first electron transport layer, the second electron transport layer has a greater refractive index than the other that is further away from the cathode.

4. The organic light-emitting display panel according to claim 1, wherein, in a direction perpendicular to the array substrate surface, a distance between the first color light-emitting layer and the cathode is greater than a distance between the second color light-emitting layer and the cathode.

5. The organic light-emitting display panel according to claim 1, wherein the first hole transport layer is disposed between the first color light-emitting layer and the anode.

6. The organic light-emitting display panel according to claim 1, wherein the first hole transport layer is located between the second color light-emitting layer and the third hole transport layer, and the second hole transport layer is located between the third color light-emitting layer and the third hole transport layer.

7. The organic light-emitting display panel according to 1, wherein a thickness of the second hole transport layer is smaller than a thickness of the first hole transport layer.

8. The organic light-emitting display panel according to claim 1, wherein a thickness of the second electron transport layer is larger than a thickness of the first hole transport layer.

9. The organic light-emitting display panel according to claim 1, wherein the second hole transport layer is disposed between the first color light-emitting layer and the second color light-emitting layer, and the third hole transport layer.

10. The organic light-emitting display panel according to claim 9, wherein the second hole transport layer is located between the first hole transport layer and the third hole transport layer.

11. The organic light-emitting display panel according to claim 9, wherein the first hole transport layer is located between the second hole transport layer and the third hole transport layer.

12. The organic light-emitting display panel according to claim 1, wherein a distance between the third color light-emitting layer and the anode is smaller than a distance between the second color light-emitting layer and the anode.

13. An organic light-emitting display panel, comprising an array substrate;
a plurality of driving elements in the array substrate; and
an organic light-emitting component corresponding to the plurality of driving elements,
wherein:
the organic light-emitting component includes an anode, a cathode, and an organic functional layer between the anode and the cathode, wherein the organic functional layer includes a light-emitting layer and a first electron transport layer located between the light-emitting layer and the cathode,
the organic light-emitting component includes a first organic light-emitting part, a second organic light-emitting part, and a third organic light-emitting part, wherein the first organic light-emitting part includes a first color light-emitting layer, and a second electron transport layer is disposed between the first color light-emitting layer and the cathode,
the second organic light-emitting part includes a second color light-emitting layer, and a first hole transport layer is disposed between the second color light-emitting layer and the anode, and the third organic light-emitting part includes a third color light-emitting layer, and a second hole transport layer is disposed between the third color light-emitting layer and the anode wherein, for the first electron transport layer and the second electron transport layer, a layer that is closer to the cathode is doped with a first dopant, and the first dopant includes one of an alkaline earth metal element and a rare earth metal element.

14. The organic light-emitting display panel according to claim 1, wherein an electron injection layer is disposed between the cathode and one of the first electron transport layer and the second electron transport layer that is closer to the cathode, and a refractive index of the electron injection layer for visible light is greater than refractive indexes of the first electron transport layer and the second electron transport layer for visible light.

15. The organic light-emitting display panel according to claim 14, wherein the electron injection layer includes at least one of an alkaline earth metal element and a rare earth metal element.

16. An organic light-emitting display device, comprising:
a signal-generating component for generating a signal; and
an organic light-emitting display panel for displaying the signal, the organic light-emitting display panel including:
an array substrate;
a plurality of driving elements in the array substrate; and
an organic light-emitting component corresponding to the plurality of driving elements, wherein:
the organic light-emitting component includes an anode, a cathode, and an organic functional layer between the anode and the cathode, wherein the organic functional layer includes a light-emitting layer and a first electron transport layer located between the light-emitting layer and the cathode,
the organic light-emitting component includes a first organic light-emitting part, a second organic light-emitting part, and a third organic light-emitting part, wherein the first organic light-emitting part includes a first color light-emitting layer, and a second electron transport layer is disposed between the first color light-emitting layer and the cathode, the second organic light-emitting part includes a second color light-emitting layer, and a first hole transport layer is disposed between the second color light-emitting layer and the anode, the third organic light-emitting part includes a third color light-emitting layer, and a second hole transport layer is disposed between the third color light-emitting layer and the anode, and a third hole transport layer is disposed between the light-emitting layer and the anode, wherein the first hole transport is directly sandwiched by the second color light-emitting layer and the third hole transport layer.

17. The organic light-emitting display device according to claim 16, wherein the first color is red, the second color is green, and the third color is blue.

18. The organic light-emitting display device according to claim 16, wherein,
when the first electron transport layer is closer to the cathode than the second electron transport layer, the first electron transport layer has a greater refractive index than a layer that is further away from the cathode, and
when the second electron transport layer is closer to the cathode than the first electron transport layer, the second electron transport layer has a greater refractive index than the other that is further away from the cathode.

19. The organic light-emitting display device according to claim 16, wherein, in a direction perpendicular to the array substrate surface, a distance between the first color light-emitting layer and the cathode is greater than a distance between the second color light-emitting layer and the cathode.

20. The organic light-emitting display panel according to claim 1, wherein:
the second hole transport is directly sandwiched by the third color light-emitting layer and the third hole transport layer, and
the first hole transport layer is not formed between the third hole transport layer and the first color light-emitting layer.

* * * * *